United States Patent [19]

Hiwada et al.

[11] Patent Number: 4,975,639
[45] Date of Patent: Dec. 4, 1990

[54] TEST HEAD WITH IMPROVED SHIELDING

[75] Inventors: Kiyoyasu Hiwada, Tokyo; Toshio Tamamura, Hachioji, both of Japan

[73] Assignee: Hewlett-Packard Company, Palo Alto, Calif.

[21] Appl. No.: 238,711

[22] Filed: Aug. 30, 1988

[30] Foreign Application Priority Data
Nov. 14, 1987 [JP] Japan .................................. 62-288191

[51] Int. Cl.⁵ ...................... G01R 1/06; G01R 31/02
[52] U.S. Cl. ............................ 324/158 P; 324/72.5; 324/158 F
[58] Field of Search ........... 324/158 P, 158 F, 73 PC, 324/72.5

[56] References Cited
U.S. PATENT DOCUMENTS
4,138,643 2/1979 Beck et al. ..................... 324/158 F
4,740,746 4/1988 Pollock et al. ................. 324/158 P Primary Examiner—Ernest F. Karlsen

[57] ABSTRACT

A test head comprising an electrically conductive cylindrical member for coupling to a device under test, a first path for connecting a first type of signal with the device under test, the first path being located outside the cylindrical member, and a second path for connecting a second type of signal with the device under test, the second path being located inside the cylindrical member, hereby preventing interference between signals of the first and second types. The first type of signal may be a digital signal and the second type of signal may be an analog signal.

1 Claim, 6 Drawing Sheets

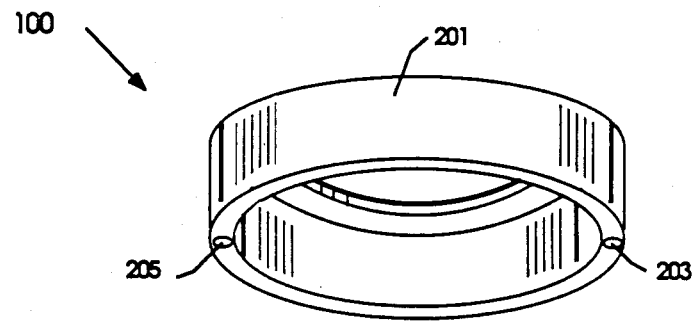
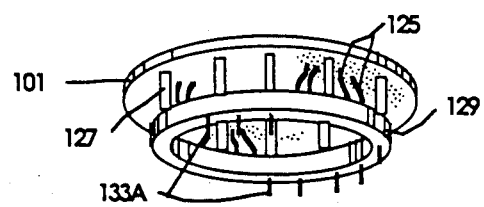
FIG. 3
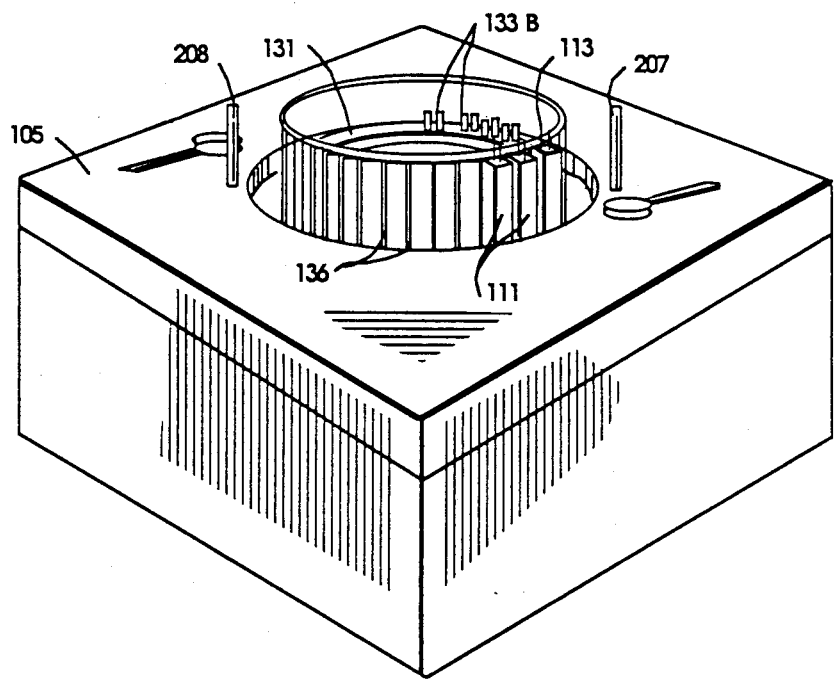

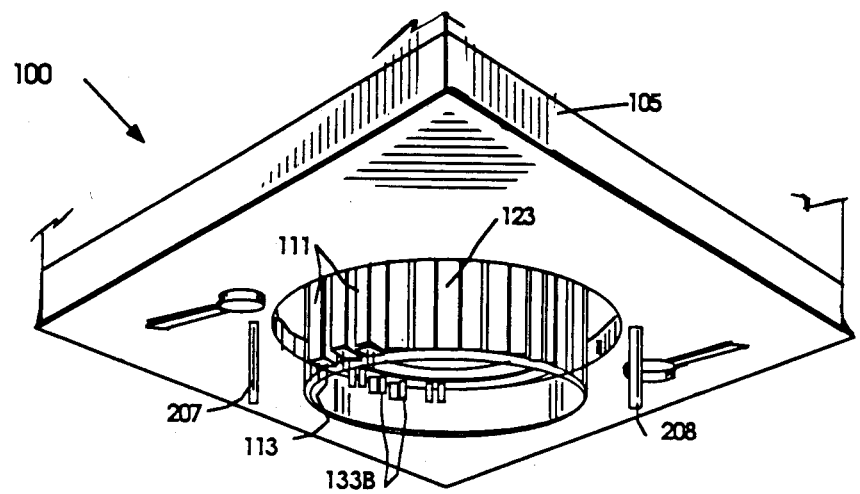
FIG. 5
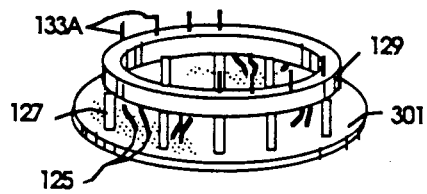
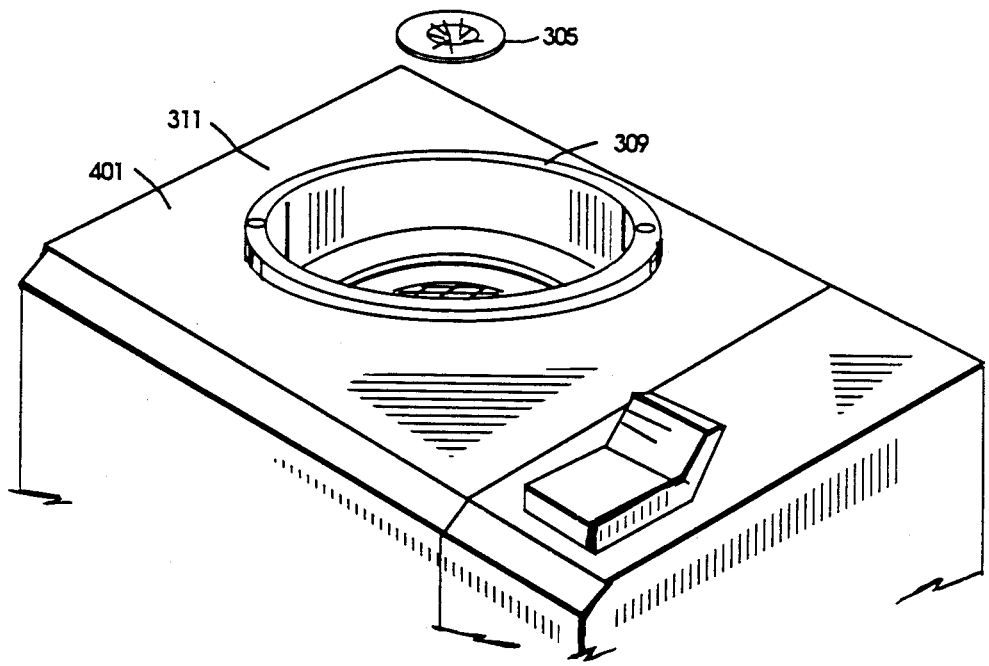

TEST HEAD WITH IMPROVED SHIELDING

FIELD OF THE INVENTION

This invention relates to an improved test head serving as an interface between a device under test (DUT) and a test system for testing semiconductor devices or the like.

BACKGROUND OF THE INVENTION

For performing the testing of semiconductor devices in which it is necessary to provide to and/or accept from the devices analog and digital signals of high frequency, there have been efforts to reduce mutual interference or degradation of these signals during transmission.

For example, Japanese Utility Model Application No. 61-11294 entitled "Probe Apparatus" and Japanese Utility Model Application No. 61-11295 entitled "Probe Apparatus," both filed on Jan. 29, 1986 by Yokogawa-Hewlett-Packard, Ltd., disclose configurations which are intended to preserve a coaxial structure as far ahead as possible when connecting a probe card, equipped with probes being brought into contact with a semiconductor to be measured, electrically with a measuring apparatus. According to these prior applications, a thick metal ring is provided for connecting the probe card with the measuring apparatus. Through openings or holes are formed in the thick wall of the metal ring and extend parallel to the axis thereof. Embedded in these holes are contact probes, each serving as an inner conductor of the coaxial structure. The inner wall of each hole serves as the outer conductor of the coaxial structure.

Such a structure, however, still tends to introduce interference from the digital signal system into the analog signal system, both of which should be of high speed and high accuracy because the digital and analog signal systems are already close to each other at the entrance portion of the ring on the side of the measuring apparatus (including the signal sources). This interference will be described below in greater detail with reference to a drawing.

SUMMARY OF THE INVENTION

A primary object of the invention is to overcome the aforementioned drawbacks of the prior art and to provide a test head which substantially completely eliminates interference between such signals as analog signals and digital signals and enables precise testing. It does this by completely separating the paths of these signals, between which interference should not occur.

One embodiment of the present invention provides for testing a DUT using both analog and digital test signals, a test head comprising an electrically conductive cylindrical member having one end attached to a DUT board or the like for connection to the DUT. A large number of pin boards for transmitting the digital signals is disposed radially outside the cylindrical member, and the pin boards are brought into contact with the back side of the DUT board via contact probes that form transmission paths for the digital signals. On the other hand, transmission paths for the analog signals are routed inside the electrically conductive cylindrical member up to the DUT board.

With the above-described configuration, the electrically conductive cylindrical member substantially completely shields the digital signals and the analog signals from each other until immediately before the DUT, preventing interference between the two types of signals.

BRIEF DESCRIPTION OF THE DRAWINGS

FIG. 3 is an exploded perspective view of the test head shown in FIG. 1.

FIG. 5 is an exploded perspective view of the test head shown in FIG. 4.

DETAILED DESCRIPTION OF THE EMBODIMENT

Figure 6:
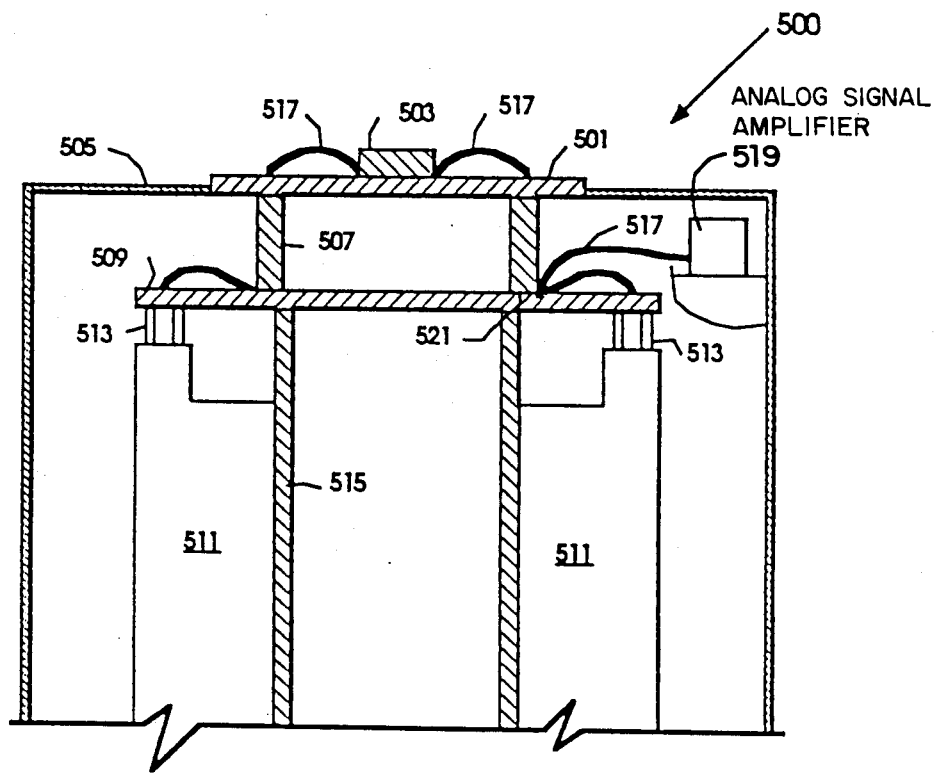
FIG. 6 is a sectional view of a conventional test head.

FIG. 6 shows a schematic sectional view of a conventional test head. In this drawing, disposed at the distal end (on the upper side in the drawing) of a test head 500 is a DUT board 501, with which a DUT 503 is connected (via a socket or the like) on the board 501. In the inside of a housing 505 of the test head 500, the DUT board 501 is connected with a performance board 509 via a metallic connection ring 507 having a configuration like that disclosed in the foregoing prior Japanese applications. This performance board 509, in turn, is connected on its rear side with a large number of pin boards 511, via contact probes 513 provided at the upper end of each pin board 511. Though FIG. 5 shows only two pin boards 511, a large number of such pin boards is actually disposed radially about a support member 515 located at the center as is done in digital IC testers or the like. Furthermore, provided on performance board 509 and DUT board 501 may be printed patterns, cables and the like (not shown) to provide any desired electrical connection.

In such a test head 500, the path for the digital signals, when leading from the measuring apparatus (not shown) to the DUT 503, is: the measuring apparatus, the pin boards 511, the contact probe 513 the performance board 509, the connection ring 507, the DUT board 501, and the DUT 503. On the other hand, the path for the analog signals, when leading from the DUT 503 to the measuring apparatus, is: the DUT 503 the DUT board 501, the connection ring 507, an analog signal cable 517, an analog signal amplifier 519, and the measuring apparatus. In a system where wide band analog signals coexist and are mixed with high speed digital signals, interference between the analog signals and the digital signals should be avoided as far as possible. In a conventional configuration as illustrated, it might appear that the analog signals and the digital signals could be transmitted through individual coaxial structures; however, because it is impossible in such a configuration to separate spatially these two types of signals sufficiently from each other, it is difficult to provide sufficient shielding around a connection point 521 between the performance board 509 and the connection ring 507. Hence, measures to suppress interference are not yet complete.

Figure 1:
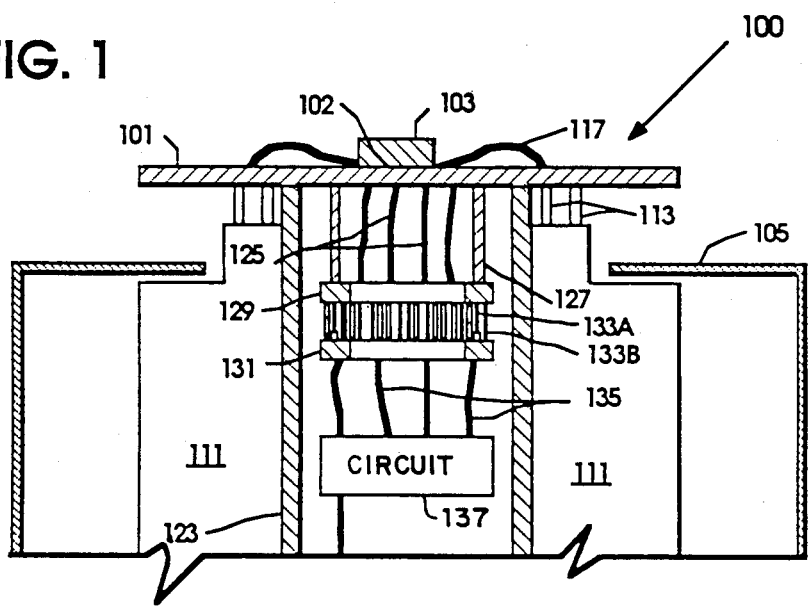
FIG. 1 is a sectional view of a test head according to an embodiment of the present invention.

FIG. 1 is a simplified sectional view of a test head 100 in accordance with the present invention. The test head 100 includes a DUT board 101. A DUT 103 is mounted to the DUT board 101 by means of a socket 102 or the like. The DUT 103 is supported on a housing 105.

Among the input/output signal paths for the DUT 103, the digital signals pass through digital signal coaxial cables 117 (or printed patterns on the DUT board 301) and then enter pin boards 111 via contact probes 113. That is, the paths 117 for the digital signals are fundamentally similar to the conventional configuration shown in FIG. 6. But this novel configuration enables the pin board 111 to contact the DUT board 101 directly. This reduces the number of the connection points existing along one signal path between the pin board 111 and the DUT board 101 from three in the prior art structure shown in FIG. 6 to one point, which improves reliability.

On the contrary, the paths for the analog signals are totally different from those of the conventional configuration, in that immediately after leaving the DUT 103 the paths for the analog signals are separated completely from those for digital signals and lead through and inside of a metallic cylinder 123. Specifically, after leaving the DUT 103 those paths pass from the back side of the DUT board 101 through analog signal coaxial cables 125 and enter an interface ring 129 that is fixed to the DUT board 101 by supporting poles 127.

Figure 2:
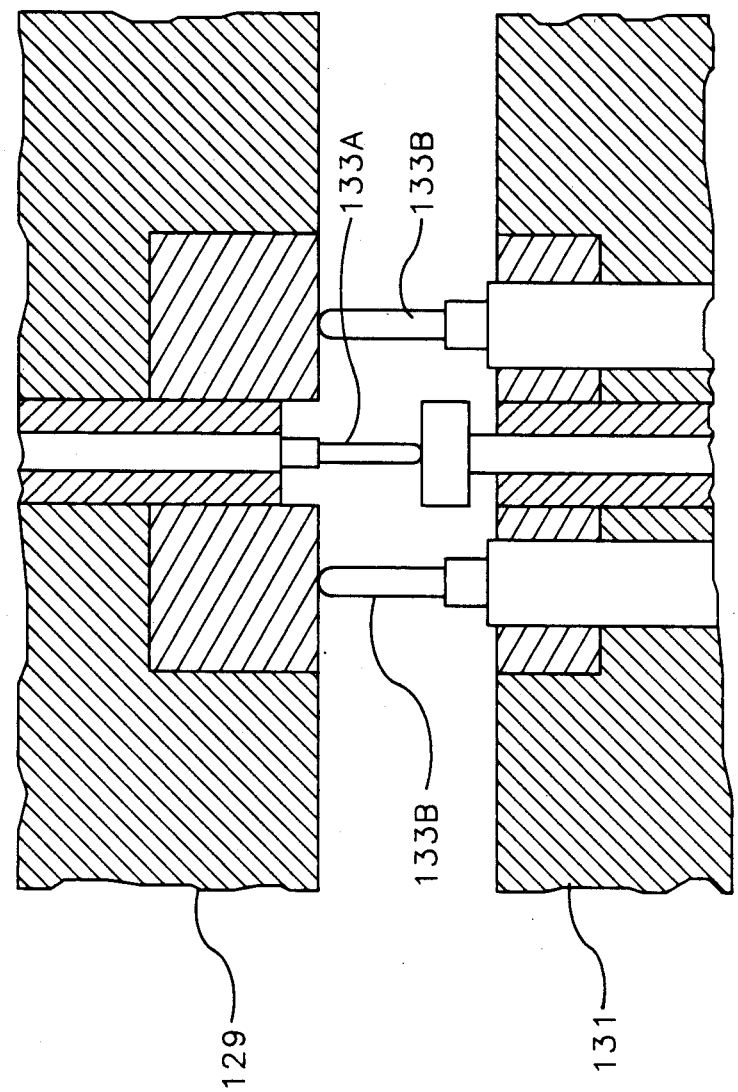
FIG. 2 is an enlarged portion of the test head showing the probe contacts in greater detail.

Once entering the interface ring 129, the analog signal then passes through the detachable structure for signal transmission shown in FIG. 2 to another interface ring 131 disposed opposite to the interface ring 129. The analog signal is then lead through an analog signal coaxial cable 135 to a circuit 137. In FIG. 2, a contact probe 133A and contact pad 133C are connected respectively to the center conductors of the corresponding analog signal coaxial cables 125 and 135. Contact probes 133B are connected to the outer conductor of the corresponding analog signal coaxial cable 135 and they contact the contact pads (not shown) on the interface ring 129 which are connected to the outer conductor of the analog signal coaxial cable 125. (The interface rings 129 and 131 are made of insulating material, and so the different coaxial cables in each interface ring are mutually insulated here.) Though only two contact probes 133B are shown in FIG. 2, more contact probes 133 (e.g., four probes) surround contact probes 133A for the center conductor to maintain the coaxial cable-like structure between these two interface rings 129 and 131. The analog signal then passes through contact probes 133B and another interface ring 131 disposed opposite to the interface ring 129 (see FIG. 2) and is lead through analog signal coaxial cables 135 to a circuit 137. The circuit 137 includes calibrating circuits, multiplexers, etc. Because it is desirable that these circuit components be disposed as close to the DUT 103 as a possible and that the signal paths leading to the DUT 103 be symmetrically arranged, the foregoing configuration is of importance, in that the circuit components can be disposed immediately below the DUT 103 inside the test head 100. Since the operation and the like of those circuit components themselves have no direct relation to the subject matter of the present invention and are well-known to those skilled in the art, no further description will be given here.

FIG. 3 shows a partially exploded perspective view of the test head 100 of the embodiment shown in FIG. 1. As illustrated, a DUT board 101 is fitted into a DUT board adapter 201, not shown in FIG. 1, and is then attached to the cylinder 123 in such a matter that guide pins 207 and 208 are individually inserted into corresponding holes 203 and 205 formed in the lower surface of the adapter 201. As a result, the DUT board 101 is positioned with respect to the cylinder 123. The lower side of the interface ring 129 is studded with contact probes 133A that are connected to the inner conductors of the analog signal coaxial cables 125. The upper side of the interface ring 131 is studded with contact probes 133B that are connected to the outer conductors of the analog signal coaxial cables 135. FIG. 3 shows the state in which almost all of the pin boards 111 are removed. As will be well appreciated from this drawing, a large number of longitudinal grooves 136 are formed in the periphery of the cylinder 123. These longitudinal grooves 136 are used as guides for one side edge of the pin boards 111. The other side edge of each pin board 111 is supported by a guide (not shown). The bottom edge of each pin board 111 is connected to a connector (not shown).

The mechanical structure of the signal transmission paths is of some importance; different DUT boards 101 should be prepared for different DUT's. Thus, the ease of exchanging the DUT boards without degradation of the quality of the signals passing therethrough is important for the test head. The described structure of the DUT board 101 is suitable for this purpose. Regarding the analog signal passing therethrough when the DUT is an analog-to-digital converter or ADC, the analog test signal is what is to be converted to the corresponding digital signal by the ADC under test. When the DUT is a digital-to-analog converter or DAC, the analog signal passing within the cylinder is the analog signal generated by the DAC based on the digital signal provided thereto via the digital signal path located outside the cylinder. If the DUT is a high-speed analog-to-digital converter with, for example, a 14-bit digital output, the voltage step for the least significant digit is very small.

Figure 4:
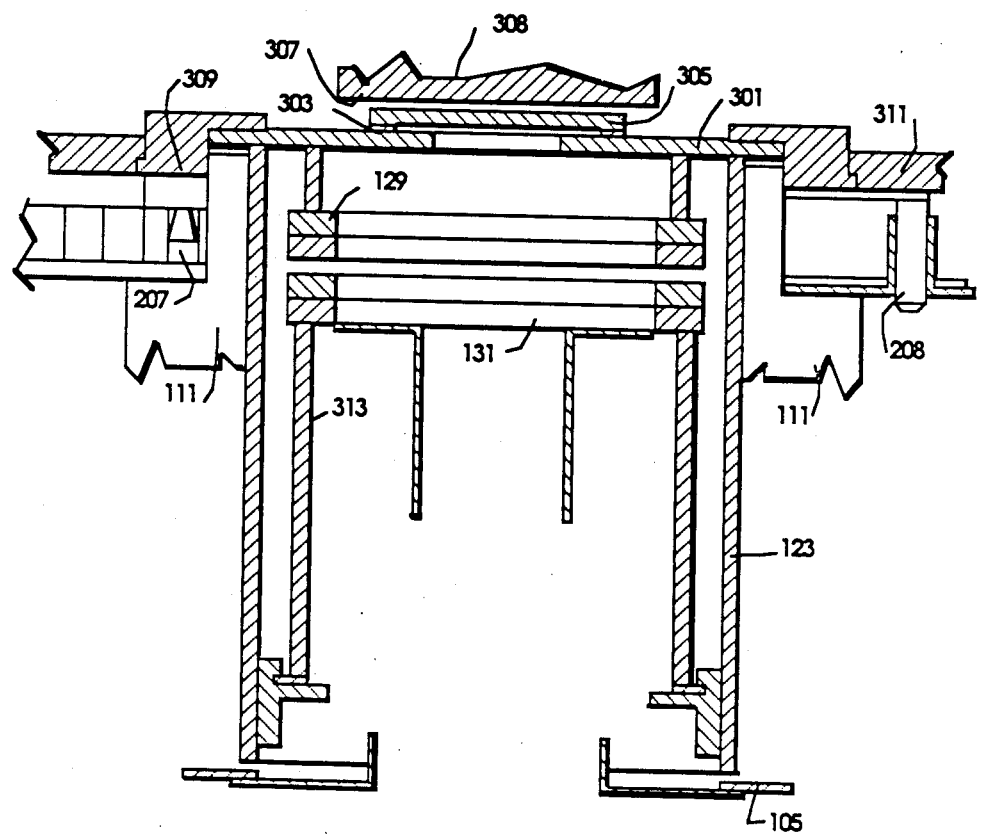
FIG. 4 is a sectional view of the test head shown according to the embodiment of the present invention with a probe card attached thereto.

FIG. 4 is a sectional view of the test head 100 and is more detailed than FIG. 1, except that a probe card 305 is attached thereto instead of the DUT board 101. Furthermore, for the purposes of clarity, the contact probes, coaxial cables, etc. are omitted. FIG. 4 shows the configuration in which the probe card 305 is attached via a spacer 303 onto a mother board 301 of the probe card 305 instead of the DUT board 101 in FIG. 1. The probe card 305 is coupled to a semiconductor wafer (not shown) to be placed on the upper surface 307 of a wafer chuck 308. 14 FIG. 4 further shows supporting poles 313 for fixing the interface ring 131 to the cylinder 123.

FIG. 5 is a partially exploded perspective view of the test head 100 of the embodiment shown in FIG. 4. The test head 100 shown in FIG. 5 is disposed upside down relative to that in FIG. 4. The test head 100 mates with ring insert 309 which is mounted on the base plate 311 of the test instrument 401.

Though the present invention is explained in detail with reference to the specific embodiment, those skilled in the art can implement with a wide range and variety of elements. Therefore, the scope of the present invention should only be determined from the attached claims. For example, although the cylinder 123 is shown as circular in section in the above-mentioned embodiment, it may take different shapes, such as a rectangular-shaped section, as needed. Furthermore, the manner of connecting the signal lines or the like in the analog or digital system should not be understood as limited to that described in the embodiment. The shapes of the members constituting the test head, the connection structure and the like should not be limited to those described in the above-embodiment, either.

We claim:
1. A test head comprising
   an electrically conductive cylindrical member having means for coupling to a device under test,
   a first path for connecting, a digital signal with said device under test, said first path being located outside said cylindrical member,
   a second path for connecting an analog signal with said device under test, said second path being located inside said cylindrical member, said second path comprising, first interface ring means located inside said cylindrical member for acting as a part of said second path, second interface ring means connected to said means for coupling to a device under test, for acting as a part of said second path, and contact probe means provided on at least one opposing surface of said first and second interface ring means,
   wherein said first interface ring means is located in such a manner that said first interface ring means contacts said second interface ring means via said contact probe means for completing a part of said second path between said first and second interface ring means, thereby preventing interference between said digital signals and said analog signals.

* * * * *